(12) United States Patent
Hellestam et al.

(10) Patent No.: US 10,529,070 B2
(45) Date of Patent: Jan. 7, 2020

(54) METHOD AND APPARATUS FOR DETECTING ELECTRON BEAM SOURCE FILAMENT WEAR

(71) Applicant: ARCAM AB, Moelndal (SE)

(72) Inventors: Calle Hellestam, Goeteborg (SE); Mattias Fager, Onsala (SE)

(73) Assignee: Arcam AB, Moelndal (SE)

( * ) Notice: Subject to any disclaimer, the term of this patent is extended or adjusted under 35 U.S.C. 154(b) by 0 days.

(21) Appl. No.: 16/154,374

(22) Filed: Oct. 8, 2018

(65) Prior Publication Data

US 2019/0147578 A1   May 16, 2019

Related U.S. Application Data

(60) Provisional application No. 62/584,161, filed on Nov. 10, 2017.

(51) Int. Cl.
| | |
|---|---|
| *G06T 7/00* | (2017.01) |
| *H01J 37/22* | (2006.01) |
| *B33Y 30/00* | (2015.01) |
| *B33Y 40/00* | (2015.01) |

(52) U.S. Cl.
CPC .............. *G06T 7/001* (2013.01); *B33Y 30/00* (2014.12); *B33Y 40/00* (2014.12); *H01J 37/222* (2013.01)

(58) Field of Classification Search
CPC ......... B33Y 30/00; B33Y 40/00; G06T 7/001; H01J 37/222
See application file for complete search history.

(56) References Cited

U.S. PATENT DOCUMENTS

| | | |
|---|---|---|
| 2,264,968 A | 12/1941 | De Forest |
| 2,323,715 A | 7/1943 | Kuehni |
| 3,634,644 A | 1/1972 | Ogden et al. |
| 3,838,496 A | 10/1974 | Kelly |
| 3,882,477 A | 5/1975 | Mueller |
| 3,906,229 A | 9/1975 | Demeester et al. |
| 3,908,124 A | 9/1975 | Rose |

(Continued)

FOREIGN PATENT DOCUMENTS

| | | |
|---|---|---|
| CA | 2860188 A1 | 6/2006 |
| CN | 101607311 A | 12/2009 |

(Continued)

OTHER PUBLICATIONS

Cheah, Chi-Mun, et al., "Automatic Algorithm for Generating Complex Polyhedral Scaffold Structure for Tissue Engineering", Tissue Engineering, 2004, pp. 595-610, vol. 10, No. 3/4, XP002691483.

(Continued)

*Primary Examiner* — Mark R Gaworecki
(74) *Attorney, Agent, or Firm* — Dinsmore & Shohl LLP

(57) ABSTRACT

A method for detecting electron beam filament wear in an electron beam source, the method comprising the steps of: enlarging a beam spot emanating from the electron beam source on a work table to a predetermined minimum size, capturing an image of the beam spot on the work table by a camera, comparing the captured image of the beam spot with a reference image, and detecting filament wear if the captured image is deviating more than a predetermined value from the reference image.

20 Claims, 7 Drawing Sheets

(56) References Cited

U.S. PATENT DOCUMENTS

| | | |
|---|---|---|
| 4,314,134 A | 2/1982 | Schumacher et al. |
| 4,348,576 A | 9/1982 | Anderl et al. |
| 4,352,565 A | 10/1982 | Rowe et al. |
| 4,401,719 A | 8/1983 | Kobayashi et al. |
| 4,541,055 A | 9/1985 | Wolfe et al. |
| 4,651,002 A | 3/1987 | Anno |
| 4,818,562 A | 4/1989 | Arcella et al. |
| 4,863,538 A | 9/1989 | Deckard |
| 4,888,490 A | 12/1989 | Bass et al. |
| 4,927,992 A | 5/1990 | Whitlow et al. |
| 4,958,431 A | 9/1990 | Clark et al. |
| 4,988,844 A | 1/1991 | Dietrich et al. |
| 5,118,192 A | 6/1992 | Chen et al. |
| 5,135,695 A | 8/1992 | Marcus |
| 5,167,989 A | 12/1992 | Dudek et al. |
| 5,182,170 A | 1/1993 | Marcus et al. |
| 5,204,055 A | 4/1993 | Sachs et al. |
| 5,247,560 A | 9/1993 | Hosokawa et al. |
| 5,393,482 A | 2/1995 | Benda et al. |
| 5,483,036 A | 1/1996 | Giedt et al. |
| 5,508,489 A | 4/1996 | Benda et al. |
| 5,511,103 A | 4/1996 | Hasegawa |
| 5,595,670 A | 1/1997 | Mombo-Caristan |
| 5,647,931 A | 7/1997 | Retallick et al. |
| 5,753,274 A | 5/1998 | Wilkening et al. |
| 5,837,960 A | 11/1998 | Lewis et al. |
| 5,876,550 A | 3/1999 | Feygin et al. |
| 5,904,890 A | 5/1999 | Lohner et al. |
| 5,932,290 A | 8/1999 | Lombardi et al. |
| 6,046,426 A | 4/2000 | Jeantette et al. |
| 6,162,378 A | 12/2000 | Bedal et al. |
| 6,204,469 B1 | 3/2001 | Fields et al. |
| 6,419,203 B1 | 7/2002 | Dang |
| 6,537,052 B1 | 3/2003 | Adler |
| 6,554,600 B1 | 4/2003 | Hofmann et al. |
| 6,583,379 B1 | 6/2003 | Meiners et al. |
| 6,676,892 B2 | 1/2004 | Das et al. |
| 6,724,001 B1 | 4/2004 | Pinckney et al. |
| 6,746,506 B2 | 6/2004 | Liu et al. |
| 6,751,516 B1 | 6/2004 | Richardson |
| 6,764,636 B1 | 7/2004 | Allanic et al. |
| 6,811,744 B2 | 11/2004 | Keicher et al. |
| 6,815,636 B2 | 11/2004 | Chung et al. |
| 6,824,714 B1 | 11/2004 | Türck et al. |
| 7,003,864 B2 | 2/2006 | Dirscherl |
| 7,020,539 B1 | 3/2006 | Kovacevic et al. |
| 7,165,498 B2 | 1/2007 | Mackrill et al. |
| 7,204,684 B2 | 4/2007 | Ederer et al. |
| 7,291,002 B2 | 11/2007 | Russell et al. |
| 7,452,500 B2 | 11/2008 | Uckelmann |
| 7,454,262 B2 | 11/2008 | Larsson et al. |
| 7,537,722 B2 | 5/2009 | Andersson et al. |
| 7,540,738 B2 | 6/2009 | Larsson et al. |
| 7,569,174 B2 | 8/2009 | Ruatta et al. |
| 7,635,825 B2 | 12/2009 | Larsson |
| 7,686,605 B2 | 3/2010 | Perret et al. |
| 7,696,501 B2 | 4/2010 | Jones |
| 7,713,454 B2 | 5/2010 | Larsson |
| 7,754,135 B2 | 7/2010 | Abe et al. |
| 7,799,253 B2 | 9/2010 | Höchsmann et al. |
| 7,871,551 B2 | 1/2011 | Wallgren et al. |
| 8,021,138 B2 | 9/2011 | Green |
| 8,083,513 B2 | 12/2011 | Montero-Escuder et al. |
| 8,137,739 B2 | 3/2012 | Philippi et al. |
| 8,187,521 B2 | 5/2012 | Larsson et al. |
| 8,308,466 B2 | 11/2012 | Ackelid et al. |
| 8,992,816 B2 | 3/2015 | Jonasson et al. |
| 9,073,265 B2 | 7/2015 | Snis |
| 9,079,248 B2 | 7/2015 | Ackelid |
| 9,126,167 B2 | 9/2015 | Ljungblad |
| 9,254,535 B2 | 2/2016 | Buller et al. |
| 9,310,188 B2 | 4/2016 | Snis |
| 9,505,172 B2 | 11/2016 | Ljungblad |
| 9,550,207 B2 | 1/2017 | Ackelid |
| 9,802,253 B2 | 10/2017 | Jonasson |
| 9,950,367 B2 | 4/2018 | Backlund et al. |
| 10,071,422 B2 | 9/2018 | Buller et al. |
| 2002/0104973 A1 | 8/2002 | Kerekes |
| 2002/0152002 A1 | 10/2002 | Lindemann et al. |
| 2002/0195747 A1 | 12/2002 | Hull et al. |
| 2003/0043360 A1 | 3/2003 | Farnworth |
| 2003/0133822 A1 | 7/2003 | Harryson |
| 2003/0205851 A1 | 11/2003 | Laschutza et al. |
| 2004/0012124 A1 | 1/2004 | Li et al. |
| 2004/0026807 A1 | 2/2004 | Andersson et al. |
| 2004/0084814 A1 | 5/2004 | Boyd et al. |
| 2004/0104499 A1 | 6/2004 | Keller |
| 2004/0148048 A1 | 7/2004 | Farnworth |
| 2004/0173496 A1 | 9/2004 | Srinivasan |
| 2004/0173946 A1 | 9/2004 | Pfeifer et al. |
| 2004/0204765 A1 | 10/2004 | Fenning et al. |
| 2004/0217095 A1 | 11/2004 | Herzog |
| 2004/0247080 A1* | 12/2004 | Feda ................. G01N 23/223 378/101 |
| 2005/0173380 A1 | 8/2005 | Carbone |
| 2005/0186538 A1 | 8/2005 | Uckelmann |
| 2005/0282300 A1 | 12/2005 | Yun et al. |
| 2006/0108712 A1 | 5/2006 | Mattes |
| 2006/0138325 A1 | 6/2006 | Choi |
| 2006/0145381 A1 | 7/2006 | Larsson |
| 2006/0147332 A1 | 7/2006 | Jones et al. |
| 2006/0157892 A1 | 7/2006 | Larsson |
| 2006/0180957 A1 | 8/2006 | Hopkinson et al. |
| 2006/0284088 A1 | 12/2006 | Fukunaga et al. |
| 2007/0074659 A1 | 4/2007 | Wahlstrom |
| 2007/0175875 A1 | 8/2007 | Uckelmann et al. |
| 2007/0179655 A1 | 8/2007 | Farnworth |
| 2007/0182289 A1 | 8/2007 | Kigawa et al. |
| 2007/0298182 A1 | 12/2007 | Perret et al. |
| 2008/0123815 A1* | 5/2008 | Feda ................. G01N 23/223 378/112 |
| 2008/0236738 A1 | 10/2008 | Lo et al. |
| 2009/0017219 A1 | 1/2009 | Paasche et al. |
| 2009/0152771 A1 | 6/2009 | Philippi et al. |
| 2009/0206056 A1 | 8/2009 | Xu et al. |
| 2010/0007062 A1 | 1/2010 | Larsson et al. |
| 2010/0260410 A1 | 10/2010 | Taminger et al. |
| 2010/0305743 A1 | 12/2010 | Larsson |
| 2010/0310404 A1 | 12/2010 | Ackelid |
| 2010/0316856 A1 | 12/2010 | Currie et al. |
| 2011/0061591 A1 | 3/2011 | Stecker |
| 2011/0114839 A1 | 5/2011 | Stecker et al. |
| 2011/0133367 A1 | 6/2011 | Weidinger et al. |
| 2011/0240607 A1 | 10/2011 | Stecker et al. |
| 2011/0241575 A1 | 10/2011 | Caiafa et al. |
| 2011/0293770 A1 | 12/2011 | Ackelid et al. |
| 2011/0293771 A1 | 12/2011 | Oberhofer et al. |
| 2011/0309554 A1 | 12/2011 | Liska et al. |
| 2011/0316178 A1 | 12/2011 | Uckelmann |
| 2012/0098409 A1* | 4/2012 | Dou ........................ H01J 1/15 313/341 |
| 2012/0100031 A1 | 4/2012 | Ljungblad |
| 2012/0164322 A1 | 6/2012 | Teulet et al. |
| 2012/0183701 A1 | 7/2012 | Pilz et al. |
| 2012/0193530 A1 | 8/2012 | Parker et al. |
| 2012/0211155 A1 | 8/2012 | Wehning et al. |
| 2012/0223059 A1 | 9/2012 | Ackelid |
| 2012/0225210 A1 | 9/2012 | Fruth |
| 2012/0237745 A1 | 9/2012 | Dierkes et al. |
| 2012/0266815 A1 | 10/2012 | Brunermer |
| 2013/0055568 A1 | 3/2013 | Dusel et al. |
| 2013/0162134 A1 | 6/2013 | Mattausch et al. |
| 2013/0186514 A1 | 7/2013 | Zhuang et al. |
| 2013/0216959 A1 | 8/2013 | Tanaka et al. |
| 2013/0233846 A1 | 9/2013 | Jakimov et al. |
| 2013/0264750 A1 | 10/2013 | Hofacker et al. |
| 2013/0270750 A1 | 10/2013 | Green |
| 2013/0278920 A1 | 10/2013 | Loewgren |
| 2013/0300286 A1 | 11/2013 | Ljungblad et al. |
| 2013/0343947 A1 | 12/2013 | Satzger et al. |
| 2014/0175708 A1 | 6/2014 | Echigo et al. |
| 2014/0271964 A1 | 9/2014 | Roberts, IV et al. |
| 2014/0301884 A1 | 10/2014 | Hellestam et al. |
| 2014/0308153 A1 | 10/2014 | Ljungblad |

(56) References Cited

U.S. PATENT DOCUMENTS

| | | |
|---|---|---|
| 2014/0314609 A1 | 10/2014 | Ljungblad et al. |
| 2014/0314964 A1 | 10/2014 | Ackelid |
| 2014/0348691 A1 | 11/2014 | Ljungblad et al. |
| 2014/0363327 A1 | 12/2014 | Holcomb |
| 2014/0367367 A1 | 12/2014 | Wood et al. |
| 2015/0004045 A1 | 1/2015 | Ljungblad |
| 2015/0050463 A1 | 2/2015 | Nakano et al. |
| 2015/0071809 A1 | 3/2015 | Nordkvist et al. |
| 2015/0086409 A1 | 3/2015 | Hellestam |
| 2015/0088295 A1 | 3/2015 | Hellestam |
| 2015/0130118 A1 | 5/2015 | Cheng et al. |
| 2015/0139849 A1 | 5/2015 | Pialot, Jr. et al. |
| 2015/0151490 A1 | 6/2015 | Jonasson et al. |
| 2015/0165524 A1 | 6/2015 | Ljungblad et al. |
| 2015/0165525 A1 | 6/2015 | Jonasson |
| 2015/0174658 A1 | 6/2015 | Ljungblad |
| 2015/0174695 A1 | 6/2015 | Elfstroem et al. |
| 2015/0251249 A1 | 9/2015 | Fager |
| 2015/0273622 A1 | 10/2015 | Manabe |
| 2015/0283610 A1 | 10/2015 | Ljungblad et al. |
| 2015/0283613 A1 | 10/2015 | Backlund et al. |
| 2015/0290710 A1 | 10/2015 | Ackelid |
| 2015/0306819 A1 | 10/2015 | Ljungblad |
| 2016/0052056 A1 | 2/2016 | Fager |
| 2016/0052079 A1 | 2/2016 | Ackelid |
| 2016/0054115 A1 | 2/2016 | Snis |
| 2016/0054121 A1 | 2/2016 | Snis |
| 2016/0054347 A1 | 2/2016 | Snis |
| 2016/0059314 A1 | 3/2016 | Ljungblad et al. |
| 2016/0129501 A1 | 5/2016 | Loewgren et al. |
| 2016/0167160 A1 | 6/2016 | Hellestam |
| 2016/0167303 A1 | 6/2016 | Petelet |
| 2016/0202042 A1 | 7/2016 | Snis |
| 2016/0202043 A1 | 7/2016 | Snis |
| 2016/0211116 A1 | 7/2016 | Lock |
| 2016/0236279 A1 | 8/2016 | Ashton et al. |
| 2016/0279735 A1 | 9/2016 | Hellestam |
| 2016/0282848 A1 | 9/2016 | Hellestam |
| 2016/0303687 A1 | 10/2016 | Ljungblad |
| 2016/0307731 A1 | 10/2016 | Lock |
| 2016/0311021 A1 | 10/2016 | Elfstroem et al. |
| 2017/0080494 A1 | 3/2017 | Ackelid |
| 2017/0087661 A1 | 3/2017 | Backlund et al. |
| 2017/0106443 A1 | 4/2017 | Karlsson |
| 2017/0106570 A1 | 4/2017 | Karlsson |
| 2017/0136541 A1 | 5/2017 | Fager |
| 2017/0136542 A1 | 5/2017 | Nordkvist et al. |
| 2017/0173691 A1 | 6/2017 | Jonasson |
| 2017/0189964 A1 | 7/2017 | Backlund et al. |
| 2017/0227417 A1 | 8/2017 | Snis |
| 2017/0227418 A1 | 8/2017 | Snis |
| 2017/0246684 A1 | 8/2017 | Hellestam |
| 2017/0246685 A1 | 8/2017 | Hellestam |
| 2017/0259338 A1 | 9/2017 | Ackelid |
| 2017/0282248 A1 | 10/2017 | Ljungblad et al. |
| 2017/0294288 A1 | 10/2017 | Lock |
| 2017/0341141 A1 | 11/2017 | Ackelid |
| 2017/0341142 A1 | 11/2017 | Ackelid |
| 2017/0348791 A1 | 12/2017 | Ekberg |
| 2017/0348792 A1 | 12/2017 | Fager |
| 2018/0009033 A1 | 1/2018 | Fager |
| 2018/0154444 A1 | 6/2018 | Jonasson |

FOREIGN PATENT DOCUMENTS

| | | |
|---|---|---|
| CN | 101635210 A | 1/2010 |
| CN | 201693176 U | 1/2011 |
| CN | 101607311 B | 9/2011 |
| CN | 203509463 U | 4/2014 |
| DE | 19952998 A1 | 5/2001 |
| DE | 20305843 U1 | 7/2003 |
| DE | 10235434 A1 | 2/2004 |
| DE | 102005014483 A1 | 10/2006 |
| DE | 202008005417 U1 | 8/2008 |
| DE | 102007018601 A1 | 10/2008 |
| DE | 102007029052 A1 | 1/2009 |
| DE | 102008012064 A1 | 9/2009 |
| DE | 102010041284 A1 | 3/2012 |
| DE | 102011105045 B3 | 6/2012 |
| DE | 102013210242 A1 | 12/2014 |
| EP | 0289116 A1 | 11/1988 |
| EP | 0322257 A2 | 6/1989 |
| EP | 0688262 A1 | 12/1995 |
| EP | 1358994 A1 | 11/2003 |
| EP | 1418013 A1 | 5/2004 |
| EP | 1466718 A2 | 10/2004 |
| EP | 1486318 A2 | 12/2004 |
| EP | 1669143 A1 | 6/2006 |
| EP | 1683593 A2 | 7/2006 |
| EP | 1721725 A1 | 11/2006 |
| EP | 1752240 A1 | 2/2007 |
| EP | 1952932 A2 | 8/2008 |
| EP | 2011631 A1 | 1/2009 |
| EP | 2119530 A1 | 11/2009 |
| EP | 2281677 A1 | 2/2011 |
| EP | 2289652 A1 | 3/2011 |
| EP | 2292357 A1 | 3/2011 |
| EP | 2492949 A2 | 8/2012 |
| EP | 2832474 A1 | 2/2015 |
| EP | 3065161 A1 | 9/2016 |
| FR | 2980380 A1 | 3/2013 |
| JP | H05-171423 A | 7/1993 |
| JP | 2003241394 A | 8/2003 |
| JP | 2003245981 | 9/2003 |
| JP | 2009006509 A | 1/2009 |
| SE | 524467 C2 | 8/2004 |
| WO | WO 1993/08928 A1 | 5/1993 |
| WO | WO 1996/012607 A1 | 5/1996 |
| WO | WO 1997/37523 A2 | 10/1997 |
| WO | WO 2001/081031 A1 | 11/2001 |
| WO | WO 2001/85386 A2 | 11/2001 |
| WO | WO 2002/008653 A1 | 1/2002 |
| WO | WO 2004/007124 A1 | 1/2004 |
| WO | WO 2004/043680 A2 | 5/2004 |
| WO | WO 2004/054743 A1 | 7/2004 |
| WO | WO 2004/056511 A1 | 7/2004 |
| WO | WO 2004/106041 A2 | 12/2004 |
| WO | WO 2004/108398 A1 | 12/2004 |
| WO | WO 2006/091097 A2 | 8/2006 |
| WO | WO 2006/121374 A1 | 11/2006 |
| WO | WO 2007/112808 A1 | 10/2007 |
| WO | WO 2007/147221 A1 | 12/2007 |
| WO | WO 2008/013483 A1 | 1/2008 |
| WO | WO 2008/057844 A1 | 5/2008 |
| WO | WO 2008/074287 A1 | 6/2008 |
| WO | WO 2008/125497 A1 | 10/2008 |
| WO | WO 2008/147306 A1 | 12/2008 |
| WO | WO 2009/000360 A1 | 12/2008 |
| WO | WO 2009/072935 A1 | 6/2009 |
| WO | WO 2009/084991 A1 | 7/2009 |
| WO | WO 2010/095987 A1 | 8/2010 |
| WO | WO 2010/125371 A1 | 11/2010 |
| WO | WO 2011/008143 A1 | 1/2011 |
| WO | WO 2011/011818 A1 | 2/2011 |
| WO | WO 2011/030017 A1 | 3/2011 |
| WO | WO 2011/060312 A2 | 5/2011 |
| WO | WO 2012/102655 A1 | 8/2012 |
| WO | WO 2013/092997 A1 | 6/2013 |
| WO | WO 2013/098050 A1 | 7/2013 |
| WO | WO 2013/098135 A1 | 7/2013 |
| WO | WO 2013/159811 A1 | 10/2013 |
| WO | WO 2013/167194 A1 | 11/2013 |
| WO | WO 2013/178825 A2 | 12/2013 |
| WO | WO 2014/071968 A1 | 5/2014 |
| WO | WO 2014/092651 A1 | 6/2014 |
| WO | WO 2014/095200 A1 | 6/2014 |
| WO | WO 2014/095208 A1 | 6/2014 |
| WO | WO 2014/195068 A1 | 12/2014 |
| WO | WO 2015/032590 A2 | 3/2015 |
| WO | WO 2015/091813 A1 | 6/2015 |
| WO | WO 2015/120168 A1 | 8/2015 |
| WO | WO 2015/142492 A1 | 9/2015 |

(56) References Cited

FOREIGN PATENT DOCUMENTS

WO      WO2016026664 A1     2/2016
WO      WO2018206459 A1     11/2018

OTHER PUBLICATIONS

Gibson, D.W., et al., "Additive Manufacturing Technologies: Rapid Prototyping to Direct Digital Manufacturing", 2010, pp. 126-129, Springer, New York.
Guibas, Leonidas J., et al., "Randomized Incremental Construction Of Delaunay And Voronoi Diagrams", Algorithmica, Jun. 1992, pp. 381-413, vol. 7, Issue 1-6, Springer-Verlag, New York.
Klassen, Alexander, et al., "Modelling of Electron Beam Absorption in Complex Geometries", *Journal Of Physics D: Applied Physics*, Jan. 15, 2014, 12 pages, vol. 47, No. 6, Institute Of Physics Publishing Ltd., Great Britain.
Motojima, Seiji, et al., "Chemical Vapor Growth Of LaB6 Whiskers And Crystals Having A Sharp Tip", Journal Of Crystal Growth, vol. 44, No. 1, Aug. 1, 1978 (Aug. 1, 1978), pp. 106-109.
Weigel, TH., et al., "Design And Preparation Of Polymeric Scaffolds For Tissue Engineering," Expert Rev. Med. Devices, 2006, pp. 835-851, vol. 3, No. 6, XP002691485.
Yang, et al., "The Design of Scaffolds for Use in Tissue Engineering, Part II, Rapid Prototyping Techniques", Tissue Engineering, 2002, pp. 1-11, vol. 8, No. 1, XP002691484.
International Search Report and Written Opinion for application PCT/EP2018/078633 dated Feb. 12, 2019 (13 Pages).

* cited by examiner

METHOD AND APPARATUS FOR DETECTING ELECTRON BEAM SOURCE FILAMENT WEAR

CROSS REFERENCE TO RELATED APPLICATIONS

This application claims benefit of U.S. Provisional Patent Application No. 62/584,161 filed on Nov. 10, 2017, the contents of which as are hereby incorporated by reference in their entirety.

BACKGROUND

Related Field

Various embodiments of the present invention relate to a method and apparatus for detecting electron beam filament wear.

Description of Related Art

One type of electron beam sources uses a solid filament for generating the electron beams. The filament may be made of tungsten or Lanthanum hexaboride.

The filament or cathode may be a thermionic cathode. A thermionic cathode may operate reliably at high temperatures for long periods of time and are of simple design and inexpensive to produce. The thermionic cathode is initially heated by any suitable means to a temperature sufficient for low level electron emission from its surface. An electron beam is formed by applying a high voltage between the cathode and an anode.

A worn-out filament or a filament exposed to contamination may affect the final result of the three-dimensional article. This is due to the fact that a worn-out filament will not produce the desired electron beam current density and the electron emission from the cathode may be very, different from one position to another.

There is a need in the art for a simple and reliable method for controlling the status of the filament at any given time for an electron beam source. This is especially important in additive manufacturing with the aid of electron beam melting since a single filament may be used for over 100 hours of working time at one single event. During such a long period of time it is important to verify that the electron beam emission is not deviating from the predetermined data.

BRIEF SUMMARY

Having this background, an object of the invention is to provide a method and apparatus for detecting electron beam filament wear in an electron beam source.

The above-mentioned object is achieved by the features according to the claims contained herein.

In a first exemplary aspect according to various embodiments described herein, it is provided a method for detecting electron beam filament wear in an electron beam source, the method comprising the steps of: fixing the electron beam source in a reference condition, moving a focus plane of electron beams emanating from the electron beam source a predetermined distance from a target surface for reproducing electron emission of the filament onto the target surface, capturing an image of the reproduced electron emission of the filament onto the target surface by a camera, comparing the captured image with a reference image of the reproduced electron emission of the filament onto the target surface, and detecting filament wear if a luminous flux in the captured image is deviating more than a predetermined value from the reference image.

An exemplary and non-limiting advantage of such embodiments is that filament wear can be determined easily at any time for an electron beam source. In an example embodiment the five above-recited steps may be repeated for different temperatures of the filament. This may be advantageous since different defects may show up at different filament temperatures.

In another exemplary embodiment the inventive method comprise further steps, including, by way of non-limiting example: determining a total area of electron emission below a predetermined emission value in the captured image within the boundary of the reference image of the reproduced electron emission of the filament onto the target surface, and/or detecting filament wear if a luminous flux in the captured image is deviating more than a predetermined value from the reference image and/or if the total area of emission below the predetermined emission value in the captured image is above a predetermined value.

An exemplary and non-limiting advantage of such embodiments is that the illuminous flux and/or the total area of emission is below the predetermined emission value of the filament may give a good understanding of the status of a particular filament.

In another aspect of the various embodiments described herein, it is provided a method for forming a three-dimensional article through successively depositing individual layers of powder material that are fused together with an electron beam from an electron beam source so as to form the article, wherein the method further comprising a beam filament wear detecting method mentioned above. An exemplary non-limiting advantage of such embodiment is that the status of a filament may be determined prior to starting a build and/or during the build. In an example embodiment the wear may be translated into a remaining expected lifetime of the filament. The wear may also be used as a quality check during the build to assure that the electron beam is behaving as expected for each and every layer that is to be fused.

In still another exemplary embodiment the filament wear detection method is performed before each layer of the three-dimensional article is to be fused. An exemplary and non-limiting advantage of at least this embodiment is that one may determine that the filament was acceptable prior to start fusing a powder layer and the filament was acceptable when the fusion is completed. In such way the fusion source is quality checked during the additive manufacturing process.

In yet another aspect of various embodiments described herein, it is provided a program element configured and arranged when executed on a computer a method for detecting electron beam filament wear in an electron beam source, the method comprising the steps of: fixing the electron beam source in a reference condition, moving a focus plane of electron beams emanating from the electron beam source a predetermined distance from a target surface for reproducing electron emission of the filament onto the target surface, capturing an image of the reproduced electron emission of the filament onto the target surface by a camera, comparing the captured image with a reference image, and detecting filament wear if a luminous flux in the captured image is deviating more than a predetermined value from the reference image.

An exemplary and non-limiting advantage of at least these embodiments is that the inventive method may be easily implemented in any commercially available apparatus comprising an electron beam source and a camera.

In still another aspect of the various embodiments described herein, it is provided an apparatus for detecting electron beam filament wear in an electron beam source, the apparatus comprising: means for fixing the electron beam source in a reference condition, means for moving a focus plane of electron beams emanating from the electron beam source a predetermined distance from a target surface for reproducing electron emission of the filament onto the target surface, a camera for capturing an image of the reproduced electron emission of the filament onto the target surface, means for comparing the captured image with a reference image, and means for detecting filament wear if a luminous flux in the captured image is deviating more than a predetermined value from the reference image.

An exemplary and non-limiting advantage of at least such embodiments is that filament wear can be determined easily at any time for any type of electron beam source.

BRIEF DESCRIPTION OF THE SEVERAL VIEWS OF THE DRAWINGS

Figure 1:
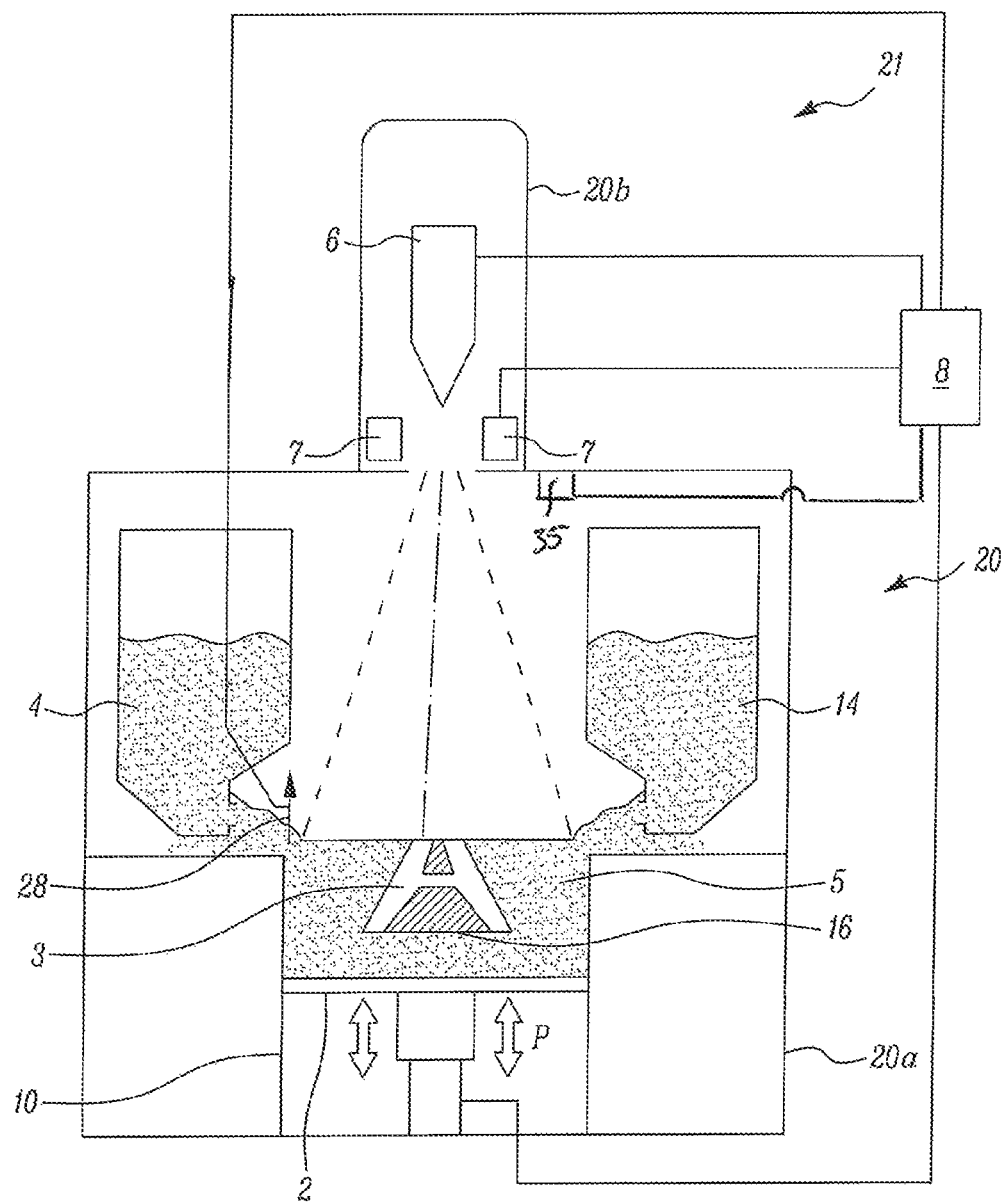
Figure 2:
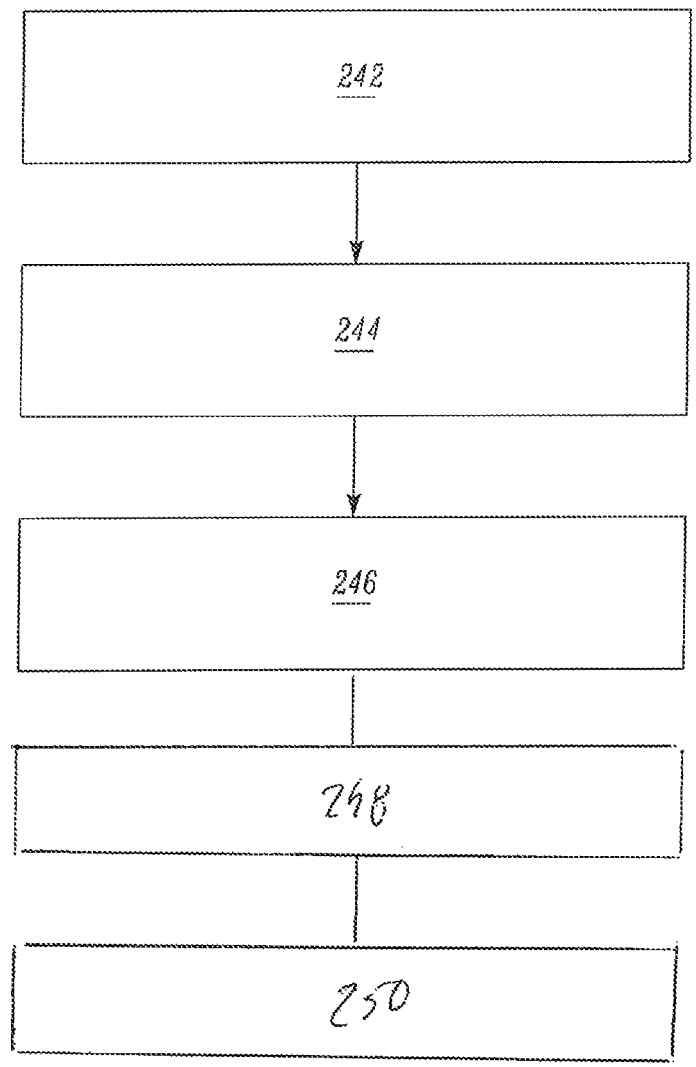

Having thus described the invention in general terms, reference will now be made to the accompanying drawings, which are not necessarily drawn to scale, and wherein:

FIG. 1 depicts a first example embodiment of an additive manufacturing apparatus according to the present invention;

FIG. 2 depicts a schematic flow chart of a method according to the present invention.

Figure 3:
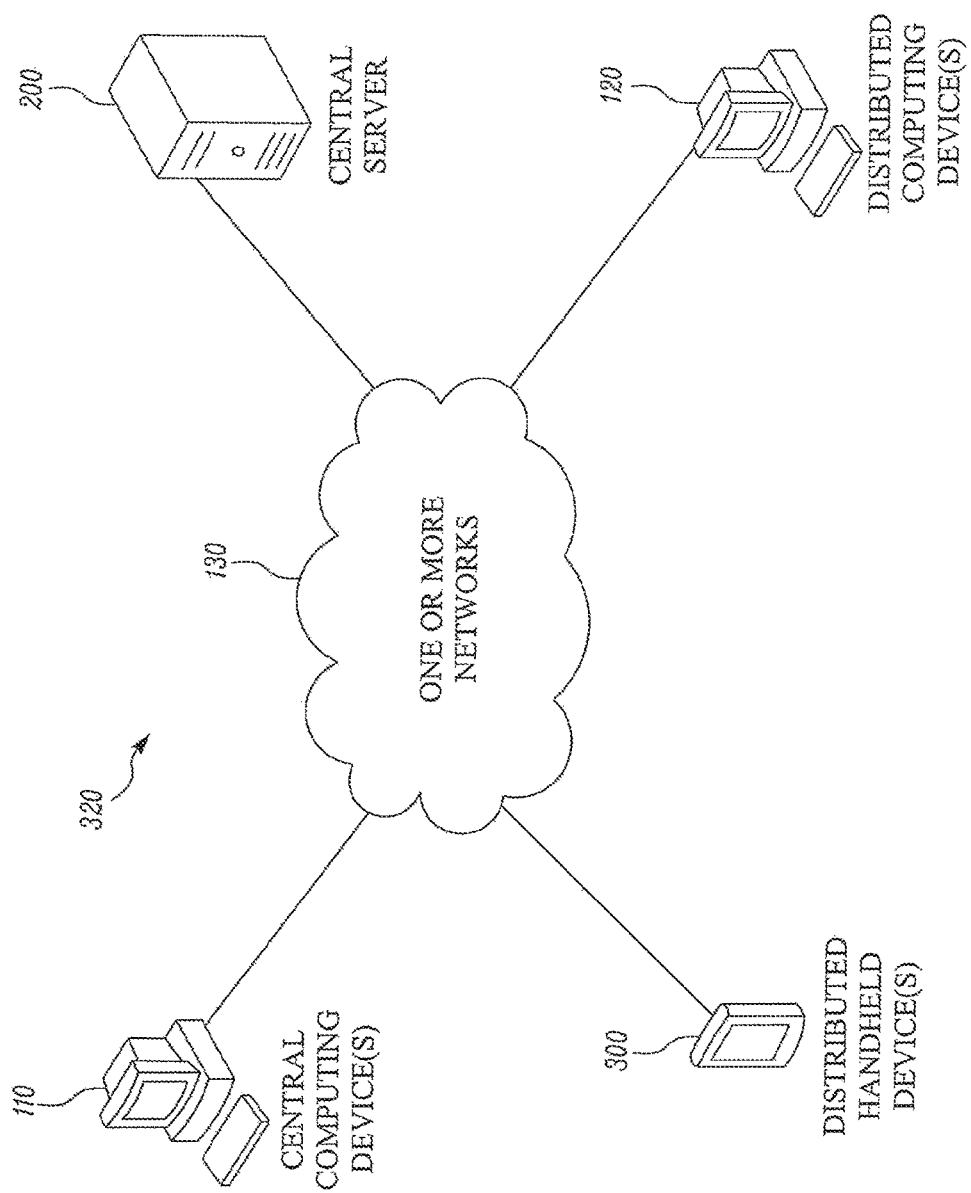
Figure 4:
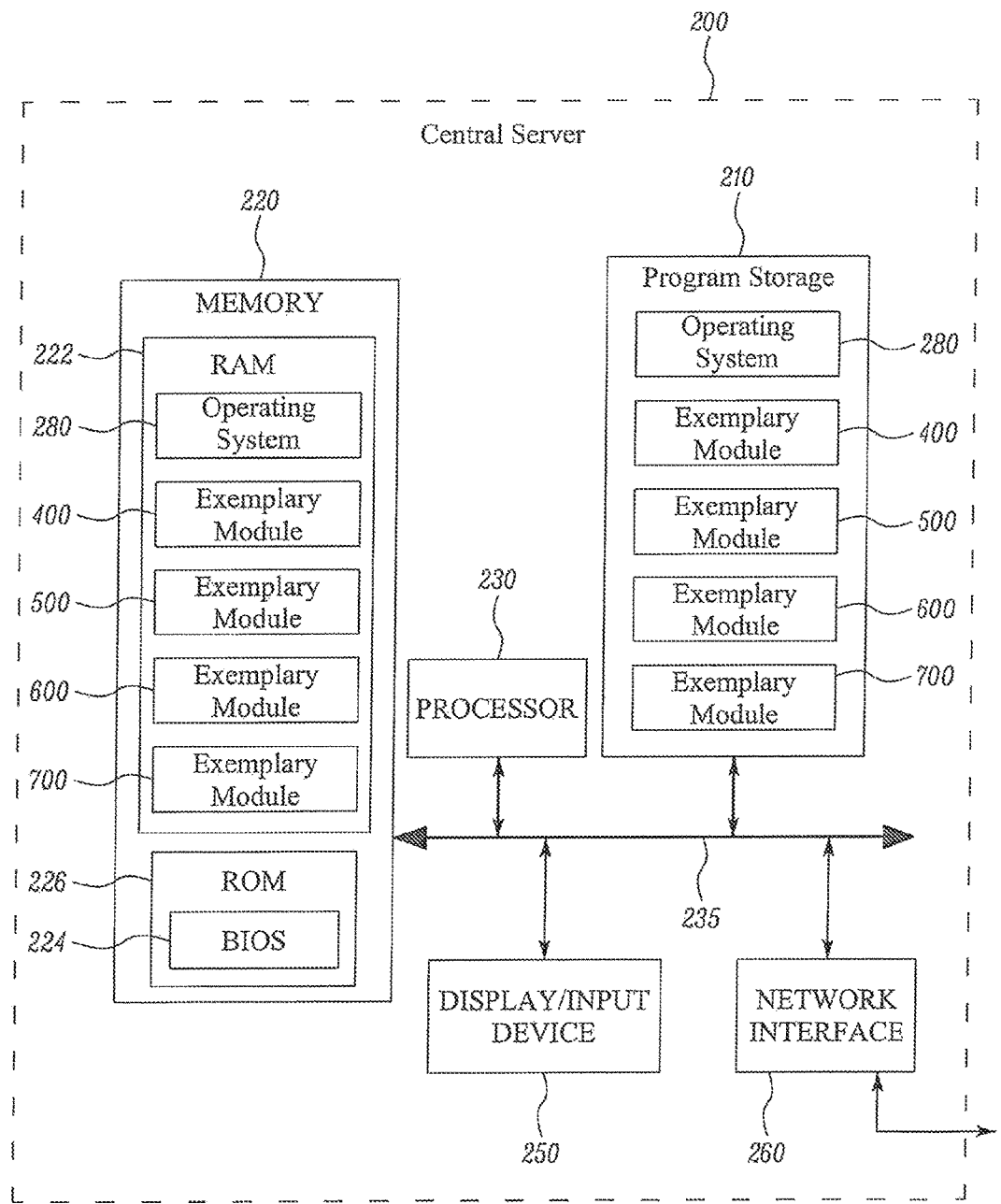
Figure 5:
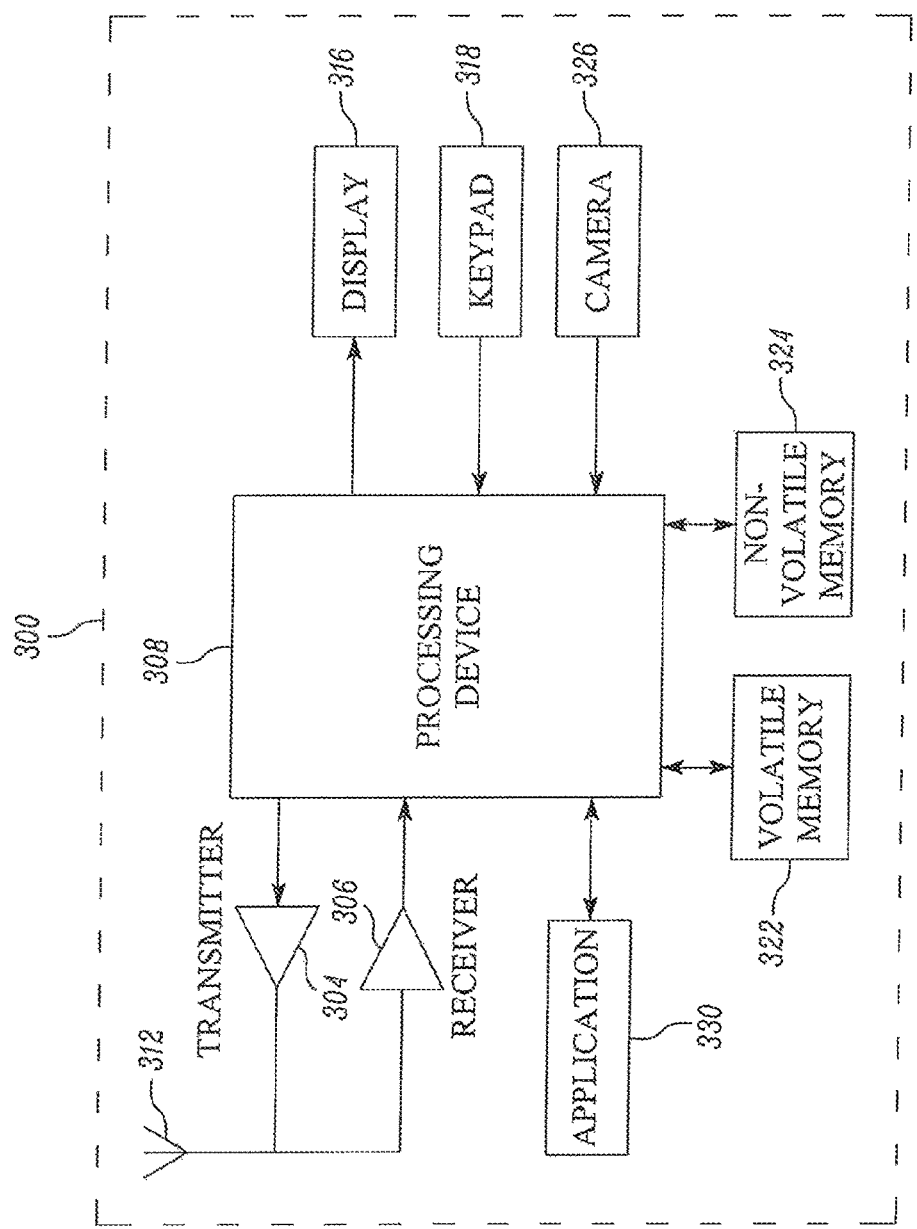

FIG. 3 is a block diagram of an exemplary system 320 according to various embodiments;

FIG. 4 is a schematic block diagram of a server 200 according to various embodiments; and FIG. 5 is a schematic block diagram of an exemplary mobile device 300 according to various embodiments.

Figure 6A:
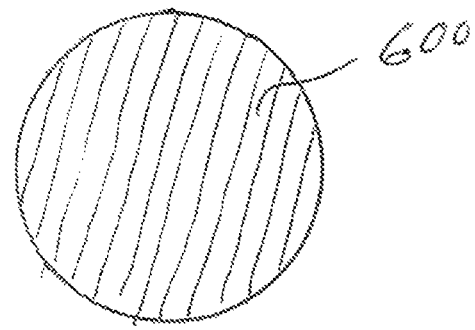

FIG. 6A is a schematic top view of a defocused electron beam spot emanating from a cathode without wear.

Figure 6B:
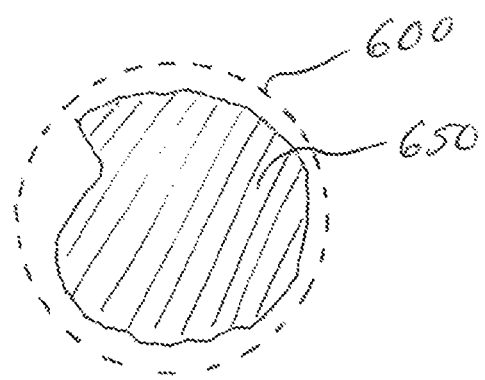
Figure 6C:
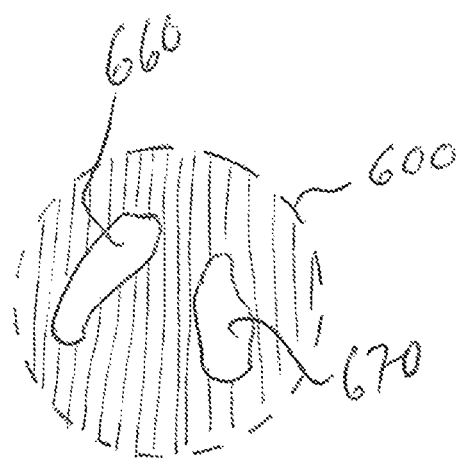

FIGS. 6B and 6C are schematic top views of two example embodiments of a defocused electron beam spot emanating from a cathode with wear.

DETAILED DESCRIPTION OF VARIOUS EMBODIMENTS

Various embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

Still further, to facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g., of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on.

FIG. 1 depicts an example embodiment of a freeform fabrication or additive manufacturing apparatus 21 according to the present invention. The apparatus 21 comprises an electron beam gun 6; electron beam optics 7; two powder hoppers 4, 14; a build platform 2; a build tank 10; a powder distributor 28; a powder bed 5; a vacuum chamber 20, and a control unit 8.

The vacuum chamber 20 may be capable of or configured for maintaining a vacuum environment by means of or via a vacuum system, which system may comprise a turbo molecular pump, a scroll pump, an ion pump and one or more valves which are well known to a skilled person in the art and therefore need no further explanation in this context. The vacuum system may be controlled by the control unit 8. Individual layers of powder material that are fused together are provided in a first section 20a of the vacuum chamber 20. The electron beam source is provided in a second section 20b of the vacuum chamber 20, wherein the first section 20a and the second section 20b are openly connected to each other.

The electron beam gun 6 is configured for generating an electron beam which may be used for pre-heating of the powder, melting or fusing together powder material provided on the build platform 2 and/or post heat treatment of the already fused powder material. The electron beam gun 6 is provided in the second section 20b of the vacuum chamber 20. The control unit 8 may be used for controlling and managing the electron beam emitted from the electron beam gun 6.

The electron beam optics 7 may comprise at least one focusing coil, at least one deflection coil 7 and optionally at least one coil for astigmatic correction.

An electron beam power supply (not shown) may be electrically connected to the control unit 8. In an example embodiment of the invention the electron beam gun 6 may generate a focusable electron beam with an accelerating voltage of about 15-120 kV and with a beam power in the range of 3-15 kW. The pressure in the first section 20a of the vacuum chamber 20 may be $1 \times 10^{-3}$ mbar or lower when building the three-dimensional article by fusing the powder layer by layer with the electron beam.

An electron beam generation cathode may be a thermionic cathode made of wolfram, an alkaline earth metal hexaboride such as Lithium hexaboride, Sodium hexaboride, Potassium hexaboride, Rubidium hexaboride, Cesium hexaboride or Francium hexaboride, or a rare earth metal hexaboride such as Scandium hexaboride, Yttrium hexaboride, Lanthanum hexaboride, Cerium hexaboride, Praseodymium hexaboride, Neodymium hexaboride, Promethium hexaboride, Samarium hexaboride, Europium hexaboride, Gadolinium hexaboride, Terbium hexaboride, Dysprosium hexaboride, Holmium hexaboride, Erbium hexaboride, Thulium hexaboride, Ytterbium hexaboride, Lutetium hexaboride.

An electron beam may be directed from the at least one electron beam source over the work table to fuse in first selected locations according to a model to form a first cross section of a three-dimensional article while supplying a gas to the second section of the vacuum chamber. The beam is directed over the build platform 2 from instructions given by the control unit 8. In the control unit 8 instructions for how to control the electron beam for each layer of the three-dimensional article is stored. The first layer of the three dimensional article 3 may be built on the build platform 2, which may be removable, in the powder bed 5 or on an optional start plate. The start plate may be arranged directly on the build platform 2 or on top of a powder bed 5 which is provided on the build platform 2.

In still another example embodiment at least one scan line in at least a first layer of at least a first three-dimensional article is fused with a first electron beam from the first electron beam source and at least a one scan line in a second layer of the at least first three-dimensional article is fused with a second energy beam from the second energy beam source.

The advantage of this embodiment is that the second energy beam source may be an electron beam source, a laser source or any other suitable means for melting the powder material. Different layer of an article may require different types of energy beam characterization. By this embodiment it is also possible to tailor the material properties by switching between different energy beam sources for different layers of the part to be manufactured.

The first electron beam source may be used for melting/fusing the powder material while a second energy beam source may be used for preheating the powder material or post heat treatment of already fused powder material.

The second energy beam source may be a resistive heater or an infrared heater for preheating the powder material or post heat treatment of already fused powder material.

In another example embodiment of the present invention the scan lines in at least one layer of at least a first three-dimensional article are fused with a first electron beam from the first electron beam source and the scan lines in at least one layer of at least a second three-dimensional article is fused with a second energy beam from the second energy beam source. By the inventive method it may be possible to manufacture simultaneously two three-dimensional article with two different energy beam sources, a first energy beam source for fusing the first three-dimensional article and a second energy beam source for fusing the second three-dimensional article. Alternatively the first and second energy beam sources are used alternating for the first and second three-dimensional article, i.e., the first and second energy beam are used for fusing powder layer in both sad first and second three-dimensional article.

The powder hoppers 4, 14 comprise the powder material to be provided on the build platform 2 in the build tank 10. The powder material may for instance be pure metals or metal alloys such as titanium, titanium alloys, aluminum, aluminum alloys, stainless steel, Co—Cr alloys, nickel-based super alloys etc.

Instead of two powder hoppers as depicted in FIG. 1 only one powder hopper may be used. Alternatively powder may be provided by other known methods for instance, one or two powder storage(s) beside the build container with a height adjustable platform for delivering a predetermined amount of powder by adjusting the height of the height adjustable platform. Powder is then raked from the powder container to the build container by a doctor blade or a powder rake.

The powder distributor 28 is arranged to lay down a thin layer of the powder material on the build platform 2. During a work cycle the build platform 2 will be lowered successively in relation to a fixed point in the vacuum chamber. In order to make this movement possible, the build platform 2 is in one embodiment of the invention arranged movably in vertical direction, i.e., in the direction indicated by arrow P. This means that the build platform 2 starts in an initial position, in which a first powder material layer of necessary thickness has been laid down. Means for lowering the build platform 2 may for instance be through a servo engine equipped with a gear, adjusting screws etc. The servo engine may be connected to the control unit 8.

After a first layer is finished, i.e., the fusion of powder material for making a first layer of the three-dimensional article, a second powder layer is provided on the build platform 2. The thickness of the second layer may be determined by the distance the build platform is lowered in relation to the position where the first layer was built. The second powder layer is typically distributed according to the same manner as the previous layer. However, there might be alternative methods in the same additive manufacturing machine for distributing powder onto the work table. For instance, a first layer may be provided by means of or via a first powder distributor 28, a second layer may be provided by another powder distributor. The design of the powder distributor is automatically changed according to instructions from the control unit 8. A powder distributor 28 in the form of a single rake system, i.e., where one rake is catching powder fallen down from both a left powder hopper 4 and a right powder hopper 14, the rake as such can change design.

After having distributed the second powder layer on the build platform, the energy beam is directed over the work table causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

The three-dimensional article which is formed through successive fusion of parts of a powder bed, which parts corresponds to successive cross sections of the three-dimensional article, comprising a step of providing a model of the three dimensional article. The model may be generated via a CAD (Computer Aided Design) tool.

A first powder layer may be provided on the work table 316 by distributing powder evenly over the worktable according to several methods. One way to distribute the powder is to collect material fallen down from the hopper 306, 307 by a rake system. The rake is moved over the build tank thereby distributing the powder over the start plate. The distance between a lower part of the rake and the upper part of the start plate or previous powder layer determines the thickness of powder distributed over the start plate. The powder layer thickness can easily be adjusted by adjusting the height of the build platform 314.

The camera 35 may be a heat sensitive camera and may be in the form of a IR-camera, a CCD-camera, a digital camera, a CMOS camera and/or a NIR-camera. In FIG. 1 the camera is arranged beside the electron beam source on a roof of the first section 20*a* of the vacuum chamber 20. In an alternative embodiment the camera may be arranged at a side wall of the first section of the vacuum chamber 20. In yet another example embodiment more than one camera maybe used.

FIG. 6A illustrates a schematic top view of a typical defocused electron beam spot 600 emanating from a cathode without wear. If the electron beam is appropriately calibrated, meaning that any optical errors in the electron beam path from the cathode element down to the target surface is compensated for by for instance adjustment of astigmatism coils and/or adjustment of position of filament and/or adjustment of position of coils, a spot 600 of the electron beam on the target surface should be of a predetermined size and shape.

In a first step 242 of a method of detecting wear of an electron beam source filament is to fix the electron beam source in a reference condition. In the reference condition the temperature of the filament is within a predetermined temperature interval. By arranging the filament to a predetermined temperature interval, the filament should have under certain circumstances a characteristic electron emissivity. In case of a diode electron beam gun the temperature is the one and only determining factor for the electron beam current. By changing the temperature of the filament, the electron beam current maybe changed. In case of a triode, the electron beam current is depending on the temperature of the filament and also the potential of a grid structure arranged in between the filament and the anode. When arranging the electron beam source in a reference condition the temperature of the filament and in case of a triode the potential of the grid construction to a predetermined level. The reference condition may also mean that the accelerating voltage is set to a predetermined value and all beam optics may have a predetermined setting.

In a second step 244 of the method for detecting wear of an electron beam source filament is to move a focus plane of the electron beams emanating from the filament in the electron beam source a predetermined distance from a target surface for reproducing electron emission of the filament onto the target surface. The movement may be done so that the focus plane is arranged the predetermined distance below the target surface. By doing so a reproduction of the filament electron emission is made onto the target surface. The distance of movement of the focus plane determines the enlargement factor of the electron beam spot, a larger distance may result in a larger electron beam spot. The movement of the focus plane may be performed by changing the setting of a focus coil in the electron beam optics. The reference condition of the electron beam source comprises a fixed setting of the focus coil such that the focus plane is moved a predetermined distance from the target surface. The reference condition may also comprise a fixed setting of other members of the beam optics such as one or more deflection coils and one or more astigmatism coils. In an alternative embodiment the focus plane may be moved by moving the target surface. In additive manufacturing the target surface is a movable table onto which powder is applied and fused in selected locations layer by layer. In such equipment the focus plane may be moved by simply moving the movable table up or down a predetermined distance.

In a third step 246 an image of the reproduced electron emission of the filament onto the target surface is captured by a camera. The camera may be arranged perpendicular to the target surface or at an angle of the target surface. In FIG. 6B it is depicted a desired spot 600, which has a dashed contour and a first example embodiment of an actual spot 650 from a filament with some sort of wear. As can be seen the actual spot 650 is smaller than the desired spot 600 and the actual spot 650 also has an irregular contour meaning that the shape is not in a form of a perfect circle anymore. The irregularities may be caused by parts of the filament being removed from the filament because of wear and/or that the filament is deposited by foreign material.

The image of the reproduced electron emission of the filament onto the target surface may be taken a predetermined time from a start of impingement of the electron beam onto a predetermined position of the target surface. The predetermined time may for instance be 0-10 ms from start of impingement. Alternatively, the image is captured after thermal equilibrium has been reached. Time from start of impingement of the electron beam on the target surface to the thermal equilibrium may be determined experimentally from case to case depending on the material used on the target surface and if the material is solid or in powder form.

In FIG. 6C it is depicted a desired spot (reference spot) 600 and an actual spot having the same shape and diameter but with two islands 660, 670 representing a colder area on the target surface. These colder areas or islands 660, 670 represents wear of the filament and/or deposition of material which is prohibiting electron emission from the filament. The islands may have zero electron emission or a reduced emission for instance below 10% of the maximum electron emission.

In a fourth step 248 the captured image is compared with a reference image of the reproduced electron emission of the filament onto the target surface.

The actual image and the reference image of the electron beam source are compared with the same reference conditions, i.e., the actual image has the same setting of the electron beam source as the reference image. The reference image may be an actual image taken with the filament when new or it may be a simulated image of how the spot should look like with the reference condition of the electron beam gun.

In a fifth step 250 filament wear is detected if a luminous flux in the captured image is deviating more than a predetermined value from the reference image. The luminous flux may be determined by analysing the intensity at every position of the actual image within the area of the desired beam spot, i.e., one is not looking outside the periphery of the desired beam spot in the actual beam spot. The intensity is then integrated over the whole surface in order to get the luminous flux. This may be accomplished automatically by a computer program which is first detecting the intensity of the image in the positions and thereafter determines the actual luminous flux of the full beam spot by integrating intensities over the desired area. This will result in an actual luminous flux in Lumen. Filament wear is detected if the actual luminous flux is deviating more than a predetermined value from the desired luminous flux in the reference image. The same method for determining the luminous flus in the actual image may be performed for determining the luminous flux in the desired image. In an alternative embodiment the desired luminous flux is set to a predetermined value which is determined experimentally and/or by simulation. The luminous flux and/or the area of emission below a certain value may be determined by PCA (Principal Component Analysis), relative brightness and/or shape detection.

In an alternative embodiment according to the present invention a total area of electron emission below a predetermined emission value in the captured image of the reproduced electron emission of the filament onto the target surface is determined. The predetermined emission value may be 5% of maximum emission. In an alternative embodiment the predetermined emission value is 2% of the maximum emission. The total area of the electron emission below the predetermined emission value in the captured image is only determined within the boundaries of the reference image, i.e., not outside an area representing the reference image. Filament wear may be detected if a luminous flux in the captured image is deviating more than a predetermined value from the reference image and/or if the total area of the electron emission below the predetermined emission value in the captured image is above a predetermined value. In still another example embodiment the predetermined emission value is zero emission.

This predetermined area may in a first example embodiment be 5% of the desired beam spot area. In another example embodiment the predetermined area is 10% of the desired beam spot area. In still another example embodiment the predetermined area is 25% of the desired beam spot area. In yet another example embodiment the predetermined area is 50% of the desired beam spot area.

In the inventive method of detecting wear of the filament, the electron beam spot is enlarged onto the target surface. The enlargement of the beam spot also results in enlargement of any defects in the beam spot at the same time. The enlargement may be made by defocusing the beam spot on the target surface, it may be a positive defocusing or a negative defocusing meaning that the actual focus may be arranged below or above the target surface at a predetermined distance. When enlarging the spot, the power per unit area on the target surface is decreased. A non-defocused electron beam may start to melt the target surface, an enlarged beam spot may not have that problem making the analyzation more efficient. The target surface may be a solid surface, for instance a start plate in additive manufacturing or an already fused top surface in additive manufacturing. The target surface may also be a powder surface. The defocused electron beam spot may be arranged on a detection area provided on the powder distributor. The detection area may be a flat surface provided on top of the powder distributor solely for the purpose of checking the beam spot.

In additive manufacturing the smallest spot diameter to be achieved may be in the range of 100-500 μm and the electron beam current may be in the range of 10-50 mA and the acceleration voltage about 60 kV. The spot may typically be enlarged 5 or 10 times from its minimum size, i.e., optimal focus for a predetermined current, resulting in a defocused beam of about a few mm in diameter. The spot that may be of interest may be the non-deflected spot. Obviously, any other position on the target may be used but all position other than the center position are using a deflected electron beam, meaning that distortions may be introduced from the deflection coil. By using the non-deflected position, one removes any defects introduced by the deflection coil system. As mentioned above any shape of the beam may be used as reference. For simplicity of description we have chosen to exemplify the reference beam spot shape as a perfect circle, which may be the desired spot shape in for instance an additive electron beam melting application for forming three-dimensional articles by fusing powder material layer by layer. Other applications and/or situations may have another beam shape as the target shape.

In the above description we have referred to an enlarged beam spot as used both as reference and actually detected. However, the enlargement is a result of a movement of the focus plane. When moving the focus plane below the target surface one will image the cathode or filament surface instead of the cross-over of the electron beams. The enlargement factor depends on the individual distances in the particular machine of interest, i.e., distance between cross over, focus coil, and target surface.

The area of emission below a predetermined emission value in the detected image may be determined by counting the area in a bit map image or a grey scale image.

In an alternative embodiment of the present invention it is provided a further step of weighting the detected area of emission below the predetermined emission value. Areas having an emission below the predetermined emission value closer to the center of the beam spot may be regarded to be worse than areas of emission below the predetermined emission value at the periphery of the beam spot. The weighting factor may be continuously increasing from the periphery to the center, going for instance from 1 to 2 or 1 to 5.

The reference condition of the electron beam source may, in an example embodiment, mean that the electron beam current is relatively low, i.e., in an interval of 1-5 mA. The temperature of the filament may be as low as possible, i.e., just above the temperature where electron emission is staring.

In yet another example embodiment the area of the detected spot with the emission value being below a predetermined value may be transformed into a remaining lifetime of the filament. In still another example embodiment the area of emission value below the predetermined emission value and/or the luminous flux of the detected beam spot may be transformed into a remaining lifetime of the cathode element. This lifetime determination may be performed continuously during the build but also before a build in order to see if the cathode to be used is going to last as long as desired. This may be especially valuable in additive manufacturing where the filament is going to be used during a longer period of time for manufacturing three-dimensional articles.

In case of a filament contaminated with $LaC_2$ or Ti, the detected spot will decrease in area and the remaining area will have a lower luminous flux compared to the reference image.

In case of a filament contaminated with $LaB_2O_3$ the luminous flux will be decreased compared to the reference image and the intensity may vary a lot over the emission surface. This type of contamination, if detected, may be burnt away for a new or relatively new filament.

In an example embodiment if the luminous flux is below 50% of reference value it is time to switch the filament to a new one. This 50% luminous flux of reference value may be predicted before start using the electron gun. If the 50% luminous flux is expected to appear during the use, the cathode should be exchanged before start using the electron beam source.

In another aspect of the invention it is provided a program element configured and arranged when executed on a computer to implement a method as described herein. The program element may be installed in a computer readable storage medium. The computer readable storage medium may be any one of the control units described elsewhere herein or another and separate control unit, as may be desirable. The computer readable storage medium and the program element, which may comprise computer-readable program code portions embodied therein, may further be contained within a non-transitory computer program product. Further details regarding these features and configurations are provided, in turn, below.

As mentioned, various embodiments of the present invention may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

FIG. 3 is a block diagram of an exemplary system 320 that can be used in conjunction with various embodiments of the present invention. In at least the illustrated embodiment, the system 320 may include one or more central computing devices 110, one or more distributed computing devices 120, and one or more distributed handheld or mobile devices 300, all configured in communication with a central server 200 (or control unit) via one or more networks 130. While FIG. 3 illustrates the various system entities as separate, stand-alone entities, the various embodiments are not limited to this particular architecture.

According to various embodiments of the present invention, the one or more networks 130 may be capable of supporting communication in accordance with any one or more of a number of second-generation (2G), 2.5G, third-generation (3G), and/or fourth-generation (4G) mobile communication protocols, or the like. More particularly, the one or more networks 130 may be capable of supporting communication in accordance with 2G wireless communication protocols IS-136 (TDMA), GSM, and IS-95 (CDMA). Also, for example, the one or more networks 130 may be capable of supporting communication in accordance with 2.5G wireless communication protocols GPRS, Enhanced Data GSM Environment (EDGE), or the like. In addition, for example, the one or more networks 130 may be capable of supporting communication in accordance with 3G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 320 may be configured to communicate with one another in accordance with techniques such as, for example, radio frequency (RF), Bluetooth™, infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 110-300 are illustrated in FIG. 3 as communicating with one another over the same network 130, these devices may likewise communicate over multiple, separate networks.

According to one embodiment, in addition to receiving data from the server 200, the distributed devices 110, 120, and/or 300 may be further configured to collect and transmit data on their own. In various embodiments, the devices 110, 120, and/or 300 may be capable of receiving data via one or more input units or devices, such as a keypad, touchpad, barcode scanner, radio frequency identification (RFID) reader, interface card (e.g., modem, etc.) or receiver. The devices 110, 120, and/or 300 may further be capable of storing data to one or more volatile or non-volatile memory modules, and outputting the data via one or more output units or devices, for example, by displaying data to the user operating the device, or by transmitting data, for example over the one or more networks 130.

In various embodiments, the server 200 includes various systems for performing one or more functions in accordance with various embodiments of the present invention, including those more particularly shown and described herein. It should be understood, however, that the server 200 might include a variety of alternative devices for performing one or more like functions, without departing from the spirit and scope of the present invention. For example, at least a portion of the server 200, in certain embodiments, may be located on the distributed device(s) 110, 120, and/or the handheld or mobile device(s) 300, as may be desirable for particular applications. As will be described in further detail below, in at least one embodiment, the handheld or mobile device(s) 300 may contain one or more mobile applications 330 which may be configured so as to provide a user interface for communication with the server 200, all as will be likewise described in further detail below.

FIG. 4 is a schematic diagram of the server 200 according to various embodiments. The server 200 includes a processor 230 that communicates with other elements within the server via a system interface or bus 235. Also included in the server 200 is a display/input device 250 for receiving and displaying data. This display/input device 250 may be, for example, a keyboard or pointing device that is used in combination with a monitor. The server 200 further includes memory 220, which typically includes both read only memory (ROM) 226 and random access memory (RAM) 222. The server's ROM 226 is used to store a basic input/output system 224 (BIOS), containing the basic routines that help to transfer information between elements within the server 200. Various ROM and RAM configurations have been previously described herein.

In addition, the server 200 includes at least one storage device or program storage 210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 210 are connected to the system bus 235 by an appropriate interface. The storage devices 210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 210 and/or memory of the server 200 may further provide the functions of a data storage device, which may store historical and/or current delivery data and delivery conditions that may be accessed by the server 200. In this regard, the storage device 210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 400-700) comprising, for example, one or more computer-readable program code portions executable by the processor 230, may be stored by the various storage devices 210 and within RAM 222. Such program modules may also include an operating system 280. In these and other embodiments, the various modules 400, 500, 600, 700 control certain aspects of the operation of the server 200 with the assistance of the processor 230 and operating system 280. In still other embodiments, it should be understood that one or more additional and/or alternative modules may also be provided, without departing from the scope and nature of the present invention.

In various embodiments, the program modules 400, 500, 600, 700 are executed by the server 200 and are configured to generate one or more graphical user interfaces, reports, instructions, and/or notifications/alerts, all accessible and/or transmittable to various users of the system 320. In certain embodiments, the user interfaces, reports, instructions, and/or notifications/alerts may be accessible via one or more networks 130, which may include the Internet or other feasible communications network, as previously discussed.

In various embodiments, it should also be understood that one or more of the modules 400, 500, 600, 700 may be alternatively and/or additionally (e.g., in duplicate) stored locally on one or more of the devices 110, 120, and/or 300 and may be executed by one or more processors of the same. According to various embodiments, the modules 400, 500, 600, 700 may send data to, receive data from, and utilize data contained in one or more databases, which may be comprised of one or more separate, linked and/or networked databases.

Also located within the server 200 is a network interface 260 for interfacing and communicating with other elements of the one or more networks 130. It will be appreciated by one of ordinary skill in the art that one or more of the server 200 components may be located geographically remotely from other server components. Furthermore, one or more of the server 200 components may be combined, and/or additional components performing functions described herein may also be included in the server.

While the foregoing describes a single processor 230, as one of ordinary skill in the art will recognize, the server 200 may comprise multiple processors operating in conjunction with one another to perform the functionality described herein. In addition to the memory 220, the processor 230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface, as will be described in further detail below. The user input interface, in turn, can comprise any of a number of devices allowing the entity to receive data from a user, such as a keypad, a touch display, a joystick or other input device.

Still further, while reference is made to the "server" 200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

FIG. 5 provides an illustrative schematic representative of a mobile device 300 that can be used in conjunction with various embodiments of the present invention. Mobile devices 300 can be operated by various parties. As shown in FIG. 5, a mobile device 300 may include an antenna 312, a transmitter 304 (e.g., radio), a receiver 306 (e.g., radio), and a processing element 308 that provides signals to and receives signals from the transmitter 304 and receiver 306, respectively.

The signals provided to and received from the transmitter 304 and the receiver 306, respectively, may include signaling data in accordance with an air interface standard of applicable wireless systems to communicate with various entities, such as the server 200, the distributed devices 110, 120, and/or the like. In this regard, the mobile device 300 may be capable of operating with one or more air interface standards, communication protocols, modulation types, and access types. More particularly, the mobile device 300 may operate in accordance with any of a number of wireless communication standards and protocols. In a particular embodiment, the mobile device 300 may operate in accordance with multiple wireless communication standards and protocols, such as GPRS, UMTS, CDMA2000, 1xRTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 300 may according to various embodiments communicate with various other entities using concepts such as Unstructured Supplementary Service data (USSD), Short Message Service (SMS), Multimedia Messaging Service (MMS), Dual-Tone Multi-Frequency Signaling (DTMF), and/or Subscriber Identity Module Dialer (SIM dialer). The mobile device 300 can also download changes, add-ons, and updates, for instance, to its firmware, software (e.g., including executable instructions, applications, program modules), and operating system.

According to one embodiment, the mobile device 300 may include a location determining device and/or functionality. For example, the mobile device 300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 300 may also comprise a user interface (that can include a display 316 coupled to a processing element 308) and/or a user input interface (coupled to a processing element 308). The user input interface can comprise any of a number of devices allowing the mobile device 300 to receive data, such as a keypad 318 (hard or soft), a touch display, voice or motion interfaces, or other input device. In embodiments including a keypad 318, the keypad can include (or cause display of) the conventional numeric (0-9) and related keys (#, *), and other keys used for operating the mobile device 300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 300 can also include volatile storage or memory 322 and/or non-volatile storage or memory 324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 300.

The mobile device 300 may also include one or more of a camera 326 and a mobile application 330. The camera 326 may be configured according to various embodiments as an additional and/or alternative data collection feature, whereby one or more items may be read, stored, and/or transmitted by the mobile device 300 via the camera. The mobile application 330 may further provide a feature via which various tasks may be performed with the mobile device 300. Various configurations may be provided, as may be desirable for one or more users of the mobile device 300 and the system 320 as a whole.

The invention is not limited to the above-described embodiments and many modifications are possible within the scope of the following claims. Such modifications may, for example, involve using a different source of energy beam than the exemplified electron beam such as a laser beam. Other materials than metallic powder may be used, such as the non-limiting examples of: electrically conductive polymers and powder of electrically conductive ceramics. Images taken from more than 2 layers may also be possible, i.e., in an alternative embodiment of the present invention for detecting a defect at least one image from at least three, four or more layers are used. A defect may be detected if the defect position in the three, four or more layers are at least partly overlapping each other. The thinner the powder layer the more powder layers may be used in order to detect a factual defect.

Indeed, a person of ordinary skill in the art would be able to use the information contained in the preceding text to modify various embodiments of the invention in ways that are not literally described, but are nevertheless encompassed by the attached claims, for they accomplish substantially the same functions to reach substantially the same results. Therefore, it is to be understood that the invention is not limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method for detecting electron beam filament wear in an electron beam source, the method comprising the steps of:
    fixing the electron beam source in a reference condition,
    moving a focus plane of electron beams emanating from the electron beam source a predetermined distance from a target surface for reproducing electron emission of the filament onto the target surface,
    capturing an image of the reproduced electron emission of the filament onto the target surface by a camera,
    comparing the captured image with a reference image of the reproduced electron emission of the filament onto the target surface, and
    detecting filament wear if a luminous flux in the captured image is deviating more than a predetermined value from the reference image.

2. The method according to claim 1, further comprising the steps of:
    determining a total area of electron emission less than a predetermined emission value in the captured image within the boundary of the reference image of the reproduced electron emission of the filament onto the target surface, and
    detecting filament wear if a luminous flux in the captured image is deviating more than a predetermined value from the reference image and/or if the total area of emission less than the predetermined emission value in the captured image is above a predetermined value.

3. The method according to claim 1, wherein the focus plane is moved the predetermined distance below the target surface.

4. The method according to claim 1, wherein the image of the reproduced electron emission of the filament onto the target surface is captured for a non-deflected electron beam.

5. The method according to claim 1, wherein the focus plane of the electron beams is moved by at least one focusing coil.

6. The method according to claim 1, wherein the predetermined distance the focus plane is moved from the target surface is 1-10 cm.

7. A method for forming a three-dimensional article, the method comprising:
    successively depositing individual layers of powder material that are fused together with an electron beam from an electron beam source so as to form the article, and
    performing the beam filament wear detecting method according to claim 1.

8. The method according to claim 7, wherein the filament wear detection method is performed when the three-dimensional article is ready.

9. The method according to claim 7, wherein the filament wear detection method is performed before each layer of the three-dimensional article is to be fused.

10. The method according to claim 7, wherein the target surface is: the powder to be fused, already fused powder, a detecting surface provided on a movable powder distributor, or a detection area outside a manufacturing area.

11. The method according to claim 1, wherein:
    the method further comprises a step of receiving and storing, within one or more memory storage areas, a model of a three-dimensional article.

12. An apparatus for detecting electron beam filament wear in an electron beam source, the apparatus comprising:
    means for fixing the electron beam source in a reference condition,
    means for moving a focus plane of electron beams emanating from the electron beam source a predetermined distance from a target surface for reproducing electron emission of the filament onto the target surface,
    a camera for capturing an image of the reproduced electron emission of the filament onto the target surface, and
    a processor configured for:
        comparing the captured image with a reference image, and
        detecting filament wear if a luminous flux in the captured image is deviating more than a predetermined value from the reference image.

13. The apparatus according to claim 12, wherein the processor is further configured for:
    determining a total area of electron emission below a predetermined emission value in the captured image within the boundary of the reference image of the reproduced electron emission of the filament onto the target surface, and
    detecting filament wear if a luminous flux in the captured image is deviating more than a predetermined value from the reference image and/or if the total area of emission being below the predetermined emission value in the captured image is above a predetermined value.

14. The apparatus according to claim 12, wherein the focus plane is moved the predetermined distance below the target surface.

15. The apparatus according to claim 12, wherein the means for defocusing the spot of the electron beam is at least one focusing lens.

16. The apparatus according to claim 12, wherein a focus coil provides the means for fixing the electron beam source in the reference condition and for moving the focus plane of the electron beams.

17. The apparatus according to claim 12, wherein the means for fixing the electron beam source in the reference condition comprise one of:

a fixed setting of a focus coil such that the focus plane is moved a predetermined distance from the target surface;

a fixed setting of one or more deflection coils; or a fixed setting of one or more astigmatism coils.

18. The apparatus according to claim 12, wherein the predetermined distance the focus plane is moved from the target surface is 1-10 cm.

19. A computer program product comprising at least one non-transitory computer-readable storage medium having computer-readable program code portions embodied therein, the computer-readable program code portions comprising one or more executable portions configured for:

fixing the electron beam source in a reference condition, moving a focus plane of electron beams emanating from the electron beam source a predetermined distance from a target surface for reproducing electron emission of the filament onto the target surface, capturing an image of the reproduced electron emission of the filament onto the target surface by a camera, comparing the captured image with a reference image, and detecting filament wear if a luminous flux in the captured image is deviating more than a predetermined value from the reference image.

20. A computer program product according to claim 19, wherein the one or more executable portions are further configured for:

determining a total area of electron emission below a predetermined emission value in the captured image within the boundary of the reference image of the reproduced electron emission of the filament onto the target surface, and detecting filament wear if a luminous flux in the captured image is deviating more than a predetermined value from the reference image and/or if the total area of emission below a predetermined emission value in the captured image is above a predetermined value.

* * * * *